(12) United States Patent
Bauer et al.

(10) Patent No.: US 7,009,288 B2
(45) Date of Patent: Mar. 7, 2006

(54) SEMICONDUCTOR COMPONENT WITH ELECTROMAGNETIC SHIELDING DEVICE

(75) Inventors: Michael Bauer, Nittendorf (DE);
Christian Birzer, Burglengenfeld (DE);
Georg Ernst, Thalmassing (DE);
Rainer Steiner, Regensburg (DE);
Hermann Vilsmeier, Regensburg (DE);
Holger Woerner, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/889,801

(22) Filed: Jul. 13, 2004

(65) Prior Publication Data

US 2005/0077596 A1    Apr. 14, 2005

(30) Foreign Application Priority Data

Jul. 14, 2003   (DE) ................................ 103 32 009

(51) Int. Cl.
*H01L 23/48* (2006.01)
(52) U.S. Cl. ...................... 257/690; 257/787; 257/789; 257/790
(58) Field of Classification Search ................ 257/690, 257/787, 789, 790
See application file for complete search history.

(56) References Cited

U.S. PATENT DOCUMENTS

| 4,661,837 A | | 4/1987 | Sono ........................... 257/660 |
| 5,656,857 A | * | 8/1997 | Kishita ........................ 257/690 |
| 5,668,406 A | * | 9/1997 | Egawa ........................ 257/690 |
| 5,869,905 A | * | 2/1999 | Takebe ........................ 257/787 |
| 5,982,026 A | * | 11/1999 | Tsunoda ....................... 257/666 |
| 6,020,637 A | * | 2/2000 | Karnezos ...................... 257/738 |
| 6,150,193 A | * | 11/2000 | Glenn .......................... 438/113 |
| 6,181,278 B1 | * | 1/2001 | Kakimoto et al. ... 343/700 MS |
| 6,432,497 B1 | * | 8/2002 | Bunyan ....................... 428/40.1 |
| 6,492,194 B1 | | 12/2002 | Bureau et al. .............. 438/106 |
| 6,696,643 B1 | * | 2/2004 | Takano ........................ 174/52.1 |
| 6,800,804 B1 | * | 10/2004 | Igarashi et al. ......... 174/35 MS |

FOREIGN PATENT DOCUMENTS

| WO | WO 99/23153 | 5/1999 |
| WO | WO 99/60627 | 11/1999 |

* cited by examiner

*Primary Examiner*—Tom Thomas
*Assistant Examiner*—Chris C. Chu
(74) *Attorney, Agent, or Firm*—Dicke, Billig & Czaja, PLLC

(57) ABSTRACT

A semiconductor component with an electromagnetic shielding device against alpha radiation, beta radiation and high-frequency electromagnetic radiation is presented. The semiconductor component includes a semiconductor chip with a circuit integrated therein with a number of electrical terminal areas and at least one ground terminal area. The semiconductor also includes a package that contains the semiconductor chip and also a chip carrier. The chip carrier has a number of external electrical terminals and an external ground terminal. The electrical terminal areas and the ground terminal areas of the semiconductor chip are electrically connected to the external electrical terminals and the external ground terminals of the chip carrier by connecting means. The semiconductor chip and the connecting means are in this case encapsulated by an electrically insulating passivation. The semiconductor chip encapsulated in this way is in turn encapsulated with an electrically and thermally conductive plastics compound, which forms the package and is electrically connected to the ground terminal.

16 Claims, 2 Drawing Sheets

SEMICONDUCTOR COMPONENT WITH ELECTROMAGNETIC SHIELDING DEVICE

CROSS-REFERENCE TO RELATED APPLICATIONS

This Utility Patent Application claims priority to German Patent Application No. DE 103 32 009.1, filed on Jul. 14, 2003, which is incorporated herein by reference.

BACKGROUND

The invention relates to a semiconductor component with an electromagnetic shielding device including a semiconductor chip with a circuit integrated therein with a number of electrical terminal areas (bonding pads) and at least one ground terminal area. The semiconductor component also includes a package, which contains the semiconductor chip, the package comprising a chip carrier with a number of external terminals and at least one external ground terminal. The semiconductor component also includes connecting means, with which the electrical terminal areas and ground terminal areas are electrically connected to the external terminals and external ground terminals.

A known semiconductor component, for example, is U.S. Pat. No. 4,661,837. In U.S. Pat. No. 4,661,837, a semiconductor component is shown, there in particular a dynamic semiconductor memory (DRAM), for which a solution is provided to the problem of "soft errors", that is, malfunctions occurring within the memory circuit as a result of so-called α radiation.

These malfunctions are therefore caused by α radiation being released by atoms which are released in the package, in particular, in the plastics compound used for the package. This release may take place on the one hand because radioactive atoms that emit α radiations as a consequence of natural radioactivity are incorporated in the plastics package compound. It may also be, however, that the compound for the package is sensitive to so-called cosmic radiation.

Semiconductor components, in particular integrated circuits, are very sensitive to radioactive radiation, that is, with respect to α radiation, β radiation and high-frequency electromagnetic radiation. This sensitivity can lead to serious problems, because failures or malfunctions in highly complex integrated circuits can have serious consequences.

In U.S. Pat. No. 4,661,837, the problem of these "soft errors" in integrated circuits, caused by electromagnetic or radioactive radiation, was countered by the semiconductor chip in the package being surrounded by a thick polyimide layer. The polyimide layer represents an effective shield, at least with respect to α radiation. However, it does not represent an effective shield with respect to high-frequency electromagnetic radiation or with respect to β radiation.

Furthermore, the use of thick polyimide layers in the case of semiconductor components packaged by wire bonding technology is unsatisfactory, because the thick polyimide layers greatly restrict the possibilities in wire bonding. This is because very large openings have to be left in the polyimide layers to allow the bonding wires to be applied to the terminal areas lying underneath them.

Furthermore, it is known to introduce into the packages of semiconductor components metal plates or metal meshes, which shield the enclosed semiconductor component with respect to electromagnetic radiation and with respect to radioactive radiation in the manner of a "Faraday cage". However, this procedure is extremely complex in production engineering terms, and is consequently very cost-intensive.

SUMMARY

One embodiment of the present invention provides a novel semiconductor component with an electromagnetic shielding device that can be produced very simply and that at the same time provides an enhanced shielding performance in comparison with the prior art, acting not only with respect to α radiation but also with respect to high-frequency electromagnetic radiation.

One embodiment according to the invention is a semiconductor component with a semiconductor chip with a circuit integrated therein with a number of electrical terminal areas and at least one ground terminal area, which is provided with a package that contains the semiconductor chip. The package has a chip carrier with a number of external terminals and at least one external ground terminal. The semiconductor chip is attached to the chip carrier by connecting means, with which the electrical terminal areas and ground terminal areas are electrically connected to the external terminals and external ground terminals. The semiconductor component is characterized in that the semiconductor chip and the connecting means are encapsulated by an electrically insulating passivation. The semiconductor chip encapsulated in this way is encapsulated with an electrically and thermally conductive first plastics compound, which forms the package. This first plastics compound is electrically connected to the ground terminal.

One embodiment of the present invention can be used in virtually all forms of construction that are currently known for semiconductor components. In one variant, a leadframe is provided as the chip carrier. In another variant of the present invention, a substrate, in particular a ceramic substrate, is provided as the chip carrier.

The invention can be used in the case of conventional semiconductor components packaged by the wire bonding technique. However, it can also be used in semiconductor components that are packaged by flip-chip technology.

In one embodiment, if the semiconductor components of the present invention are packaged by wire bonding technology, bonding wires are provided as the connecting means. If flip-chip technology is used, the connecting means are solder bumps or solder balls.

In one embodiment, a second plastics compound is provided as the passivation, for example, in the form of a thin film of plastic, which is applied either by spraying, by vapor deposition or by immersion of the semiconductor chip. Acrylic paint, various silicones and epoxy resin may be used as materials for the plastics compound or the film of plastic.

In one embodiment of the present invention, bonding wires provided with an insulating layer are used, whereby very great freedom of design is additionally obtained, because crossing over of individual bonding wires is safely possible. "Optical shorts" and "wire sweeps" of the bonding wires are avoided as a result.

The use of these passivations prevents electrical short-circuits from being able to occur between the connecting means, that is, between individual bonding wires, solder bumps or solder balls, and also between individual internal terminal areas, when the electrically and thermally conductive first plastics compound is applied.

In one embodiment, when the passivation is applied the ground terminal areas on the semiconductor chip and/or the external ground terminals remain free, so that the electrically and thermally conductive first plastics compound can be electrically connected well to them.

In a refinement of the present invention, a thermoplastic material provided with metal particles is provided as the electrically and thermally conductive first plastics compound. The metal particles may in this case have a flake-like, spherical or elliptical shape.

It is conceivable to use various lightweight metals, for example aluminum or magnesium, or else various transition metals, for example copper, zirconium, nickel, iron or cobalt. The types of metal used should as far as possible have a high absorption power for α radiation and high-frequency electromagnetic radiation.

In one configuration of the present invention, the plastics compound has a composition of 90 to 95 percent by weight metal particles, the remainder organic polymer constituents.

In a further variant of the present invention, a metal powder is introduced into a thermoplastic matrix. This mixture is then applied to the semiconductor chip that is to be packaged and is provided with the passivation, and is solidified by means of a heat treatment in such a way that during the heat treatment the organic polymer elements in the matrix evaporate. The remaining metal powder is sintered together during this heat treatment or in a subsequent further heat treatment.

Use of these plastics package compounds provided with metal particles greatly increases thermal conductivity in comparison with conventional plastics package compounds. The very high thermal conductivity of these "almost" metal packages not only allows the problem of electromagnetic "soft errors" to be effectively countered, but also various problems of heat dissipation that arise in the case of semiconductor components with high power consumption. A reduction in heat sinks or blower output is possible by the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
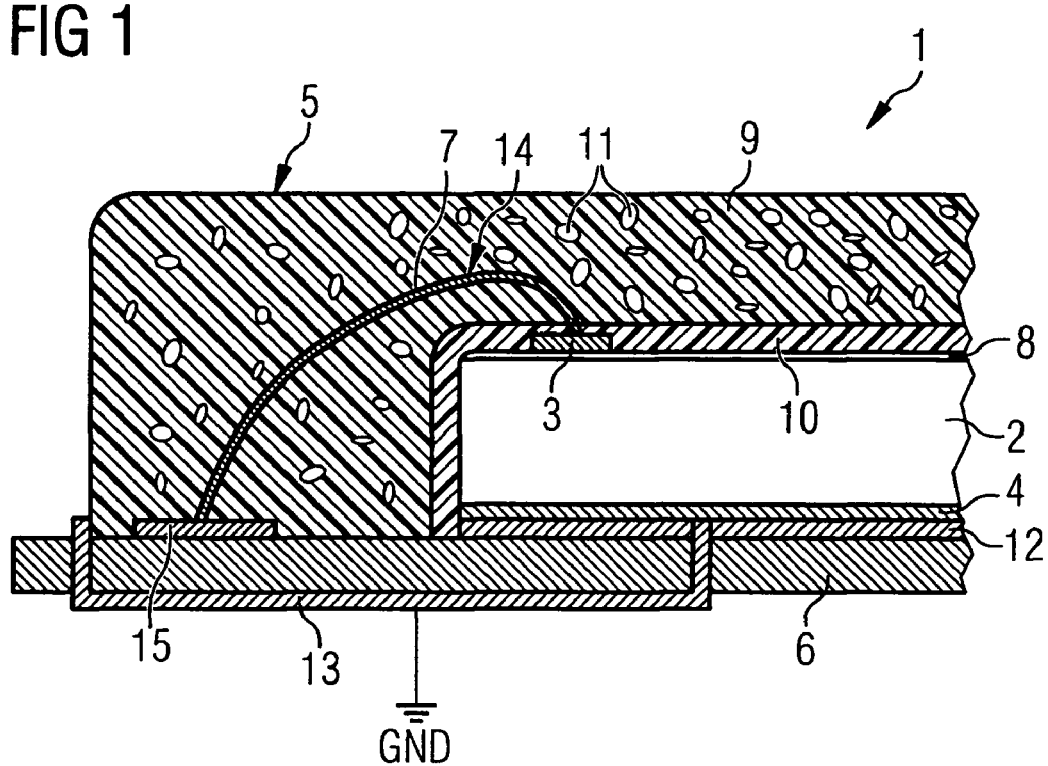
FIG. 1 illustrates a lateral cross section through a semiconductor component according to the present invention.
Figure 2:
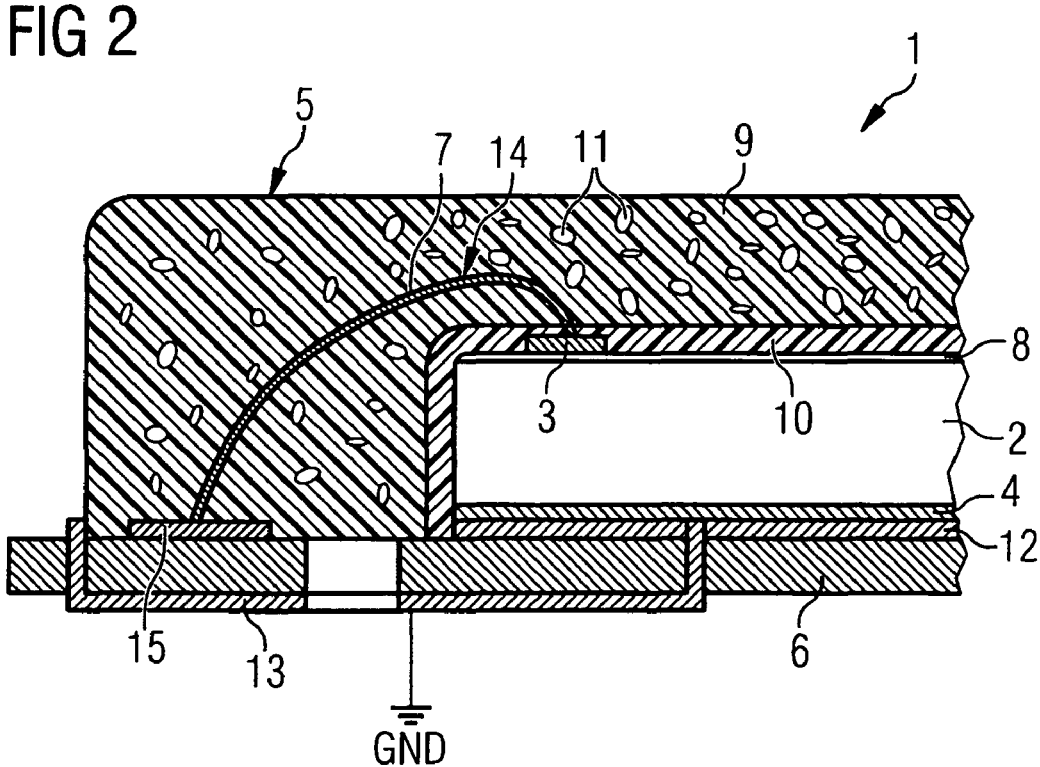
FIG. 2 illustrates a lateral cross-section through a semiconductor component according to one embodiment of the present invention.
Figure 3:
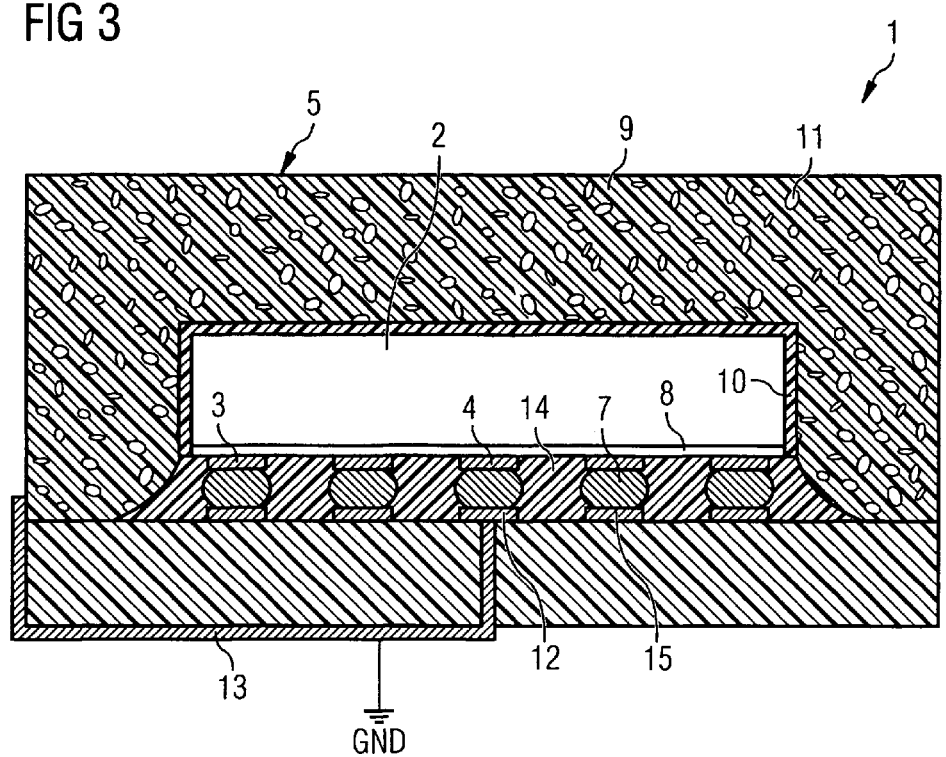
FIG. 3 illustrates a lateral cross-section through a semiconductor component according to one embodiment of the present invention.

The semiconductor component 1 illustrates in FIG. 1 comprises a semiconductor chip 2, which has an active upper side and a rear side. The active upper side is provided with an electrical terminal area 3. The rear side forms a ground terminal area 4. The semiconductor chip 2 has an integrated circuit. The semiconductor component 1 is also provided with a package 5, which contains the semiconductor chip 2. Furthermore, the package 5 is provided with a chip carrier 6 with a number of external terminals (not shown) and an external ground terminal 13.

The semiconductor chip 2 is electrically connected by its rear side, which has a ground terminal area 4, to an external ground terminal 13 by means of a soft solder connection 12.

Furthermore, the electrical terminal area 3 is electrically connected to an external electrical terminal 15 by means of a bonding wire 7.

The semiconductor chip 2 and the electrical terminal areas 3 located on it are surrounded by a film of plastic 10 electrically insulating them. The bonding wire 7 has an electrical insulation 14.

The electrical insulation 14 and the thin film of plastic 10 together form a passivation which electrically insulates the semiconductor chip 2, its electrical terminal areas 3 and the bonding wires 7. The semiconductor chip 2 encapsulated by the electrical passivation 8 is encapsulated with an electrically and thermally conductive plastics compound 9.

This plastics compound 9 has a high proportion of metal particles 11. On account of the large amount of metal particles 11 added to it, the plastics compound 9 has very good conductivity, both electrical and thermal. In the same way as the semiconductor chip 2, the plastics compound 9 is electrically connected to the external ground terminal 13.

The first plastics compound 9, provided with metal particles 11, brings about the effect that the semiconductor chip 2 is electromagnetically shielded with respect to α radiation, β radiation and high-frequency electromagnetic radiation. Radiation of the type mentioned that reaches the package 5 or gets into the plastics compound 9 is effectively dissipated by the package 5 or the plastics compound 9 via the ground terminal 13. On account of this electromagnetic shielding, "soft errors" can no longer occur in the semiconductor chip 2.

In one embodiment, the plastics compound 9 illustrated has metal particles 11, which have a spherical shape. Furthermore, in one embodiment, the plastics compound 9 has a composition comprising 90 to 95 percent by weight of these spherical metal particles. The remainder of the composition is formed by organic polymers or other organic additives.

The chip carrier 6 illustrated is in the present case a ceramic substrate. However, configurations in which no ceramic substrate or other substrate but a conventional leadframe is used are also used consistent with the present invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component with an electromagnetic shielding device comprising:
   a semiconductor chip with a circuit integrated therein with a number of electrical terminal areas and at least one ground terminal area;
   a package that contains the semiconductor chip, wherein the package further comprises a chip carrier with a number of external terminals and at least one external ground terminal;
   connection means for electrically connecting the electrical terminal areas to the external terminals and for electrically connecting the at least one ground terminal area to the at least one external ground terminal;
   wherein the connection means further comprises bond wires that are coated with an electrical insulating layer;
   wherein the semiconductor chip is encapsulated by a thin film of plastic that covers only portion of the bond wires and provides an insulating passivation; and
   wherein the semiconductor chip and the bond wires encapsulated in this way are encapsulated with an electrically and thermally conductive first plastics compound, which forms the package, the first plastics compound being connected in an electrically conducting manner to one of a group comprising the at least one ground terminal area and the at least one external ground terminal.

2. The semiconductor component of claim 1, wherein the first plastics compound is connected electrically to both the at least one ground terminal area and the at least one external ground terminal.

3. The semiconductor component of claim 1, wherein a leadframe is provided as the chip carrier.

4. The semiconductor of claim 1, wherein a substrate is provided as the chip carrier.

5. The semiconductor component of claim 4, wherein a ceramic substrate is provided as the chip carrier.

6. The semiconductor component of claim 1, wherein solder bumps are provided as the connecting means.

7. The semiconductor component of claim 1, wherein solder balls are provided as the connecting means.

8. The semiconductor component of claim 7, wherein the first plastics compound has a composition comprising 90 to 95 percent by weight of metal particles, and the remainder organic polymers.

9. The semiconductor component of claim 8, wherein a thermoplastic material is provided as the first plastics compound, a heat treatment being able to remove said material so that a composite of sintered-together metal particles remains as the package.

10. The semiconductor component of claim 1, wherein a thermoplastic material provided with metal particles is provided as the electrically and thermally conductive first plastics compound.

11. The semiconductor component of claim 10, wherein the metal particles have a flake-like shape.

12. The semiconductor component of claim 10, wherein the metal particles have a spherical shape.

13. The semiconductor component of claim 10, wherein the metal particles have an elliptical shape.

14. A semiconductor component comprising:
   a package including a chip carrier with a number of external terminals and at least one external ground terminal;
   a semiconductor chip contained within the package, the semiconductor chip having a circuit integrated therein with a number of electrical terminal areas and at least one ground terminal area;
   bond wires, which are coated with an electrical insulating layer, connecting the electrical terminal areas to the external terminals;
   a connector connecting the ground terminal area to the external ground terminal;
   wherein the semiconductor chip is encapsulated by a thin film of plastic that covers only portion of the bond wires and provides an insulating passivation; and
   wherein the semiconductor chip and the bond wires encapsulated in this way are encapsulated with an electrically and thermally conductive first plastics compound, which forms the package, the first plastics compound being connected in an electrically conducting manner to one of a group comprising the at least one ground terminal area and the at least one external ground terminal.

15. The semiconductor component of claim 14, wherein the first plastic component is electrically connected to the ground terminal area.

16. The semiconductor component of claim 15, wherein the first plastic component is electrically connected to the external ground terminal.

* * * * *